(12) United States Patent
Mizuta et al.

(10) Patent No.: US 9,006,164 B2
(45) Date of Patent: Apr. 14, 2015

(54) RESIST REMOVER COMPOSITION AND METHOD FOR REMOVING RESIST USING THE COMPOSITION

(75) Inventors: Hironori Mizuta, Saitama (JP); Masahiko Kakizawa, Saitama (JP)

(73) Assignee: Wako Pure Chemical Industries, Ltd., Osaka-shi (JP)

( * ) Notice: Subject to any disclaimer, the term of this patent is extended or adjusted under 35 U.S.C. 154(b) by 478 days.

(21) Appl. No.: 13/394,005

(22) PCT Filed: Sep. 1, 2010

(86) PCT No.: PCT/JP2010/064905
§ 371 (c)(1),
(2), (4) Date: Mar. 2, 2012

(87) PCT Pub. No.: WO2011/027773
PCT Pub. Date: Mar. 10, 2011

(65) Prior Publication Data
US 2012/0172274 A1 Jul. 5, 2012

(30) Foreign Application Priority Data
Sep. 2, 2009 (JP) ................. 2009-203143

(51) Int. Cl.
*C11D 7/60* (2006.01)
*G03F 7/42* (2006.01)
*C11D 11/00* (2006.01)

(52) U.S. Cl.
CPC ............ *G03F 7/426* (2013.01); *C11D 11/0047* (2013.01); *G03F 7/422* (2013.01); *G03F 7/423* (2013.01)

(58) Field of Classification Search
CPC ... C11D 11/0047; C11D 7/265; C11D 7/3209

USPC .................................. 510/175, 176; 134/1.3
See application file for complete search history.

(56) References Cited

U.S. PATENT DOCUMENTS

| | | | |
|---|---|---|---|
| 2010/0043823 A1* | 2/2010 | Lee | 134/1.3 |
| 2011/0021400 A1* | 1/2011 | Mizuta et al. | 510/176 |

FOREIGN PATENT DOCUMENTS

| | | |
|---|---|---|
| EP | 0382426 A2 | 8/1990 |
| JP | 3-115850 A | 5/1991 |
| JP | 5-291129 A | 11/1993 |
| JP | 2004-004775 A | 1/2004 |
| JP | 2004-317584 A | 11/2004 |
| JP | 2007-503504 A | 2/2007 |
| JP | 2008-547050 A | 12/2008 |
| WO | 2005/111187 A1 | 11/2005 |
| WO | 2006/138505 A1 | 12/2006 |
| WO | 2009/110582 A1 | 9/2009 |

OTHER PUBLICATIONS

International Search Report of PCT/JP2010/064905, mailing date Sep. 28, 2010.

\* cited by examiner

*Primary Examiner* — Gregory Webb
(74) *Attorney, Agent, or Firm* — Westerman, Hattori, Daniels & Adrian, LLP

(57) ABSTRACT

The present invention is directed to provide a resist remover composition for semiconductor substrate which enables to remove a resist simply and easily in the photolithography process in the semiconductor field, and a method for removing a resist comprising that the composition is used. The present invention relates to a resist remover composition for semiconductor substrate, comprising [I] a carbon radical generating agent, [II] an acid, [III] a reducing agent, and [IV] an organic solvent, and having pH of lower than 7, and a method for removing a resist, comprising that the composition is used.

16 Claims, No Drawings

RESIST REMOVER COMPOSITION AND METHOD FOR REMOVING RESIST USING THE COMPOSITION

TECHNICAL FIELD

The present invention relates to a remover composition for a photoresist and residue thereof in the photolithography process and a method for removing a resist using the composition. In more detail, the present invention relates to a resist remover composition which enables to remove a resist in the photolithography process in the semiconductor field and further enables to remove a resist without giving an adverse effect to a silicon oxide film in the lower part of a resist, and a method for removing a resist, comprising that the composition is used.

BACKGROUND OF THE INVENTION

Photoresist has been used in the photolithography process and the like to form a fine pattern in the semiconductor production processes, for example, for integrated circuits, transistors, and the like. For instance, when a silicon oxide film is formed with a desired pattern on a silicon substrate, the substrate is treated, for example, by the following steps. That is, firstly, a silicon oxide film is formed on the surface of a silicon substrate, a photoresist is coated on the silicon oxide film, after that, a resist film is formed. Subsequently, exposure and development are applied using a photomask corresponding to a desired pattern to obtain the desired pattern. Further, unnecessary oxide film is removed from the substrate having the obtained desired pattern, by an etching process such as plasma doping. Finally, by removing the resist and washing the surface of the substrate, a silicon oxide film forming a desired pattern can be obtained.

As a method for removing a unnecessary resist after the above-described etching process, two kinds of a dry ashing system mainly by ashing such as oxygen plasma ashing (see: for example, Patent Literature 1), and a wet system such as dipping in a stripping solvent containing various additives have been known. The oxygen plasma ashing which is one example of the dry ashing system is a method in which resist is removed by decomposing and ashing by a reaction of oxygen gas plasma and resist. This method is said to be no pollution, but has problems that the substrate surface is susceptible to be damaged unless detection of an endpoint of the reaction is carried out correctly when resist is removed by ashing, and that particles tend to adhere to and remain on the substrate surface. In addition, the method also has such problems that generally an expensive facility is required for generating plasma and the like. On the other hand, as a wet system, a method using, for example, an inorganic stripping solvent has been known, in which resist is removed by converting to an inorganic substance (ashing) by a strong oxidizing power of peroxomonosulfuric acid (Caro's acid) which is obtained by a reaction of hot concentrated sulfuric acid and hydrogen peroxide (see: for example, Patent Literature 2). However, the method has not only a problem that the method has a high risk to use concentrated sulfuric acid at a high temperature, but also another problem that the method cannot be applied to a substrate having a metal wiring such as, for example, aluminum wiring because the hot mixed acid having a strong oxidizing power forms unnecessary oxide on the metal surface or dissolves the metal.

Under such circumstances, a method for removing a resist by a simple and effective method has been desired, which does not cause such problem of a dry ashing system as mentioned above and does not cause such problem that a metal wiring is dissolved shown by an inorganic type stripping solvent represented by the wet system, and an existence of a chemical agent to satisfy this requirement has been desired.

PRIOR ART LITERATURES

Patent Literatures

Patent Literature 1: JP-A-5-291129
Patent Literature 2: JP-A-3-115850

DISCLOSURE OF INVENTION

Problem to be Solved by the Invention

The present invention has been made considering such situation as mentioned above, and is directed to provide a resist remover composition for semiconductor substrate which is capable of removing a resist simply and easily in the photolithography process in the semiconductor field, and further enables to remove a resist without giving an adverse effect to a silicon oxide film in the lower part of a resist, an implant layer formed by plasma doping, a metal wiring, and the like, provided on a substrate, as well as a method for removing a resist, comprising that the composition is used.

Means for Solving the Problem

An aspect of the present invention is a resist remover composition for semiconductor substrate, comprising [I] a carbon radical generating agent, [II] an acid, [III] a reducing agent, and [IV] an organic solvent, and having pH of lower than 7.

Also, another aspect of the present invention is a method for removing a resist, characterizing in that a resist remover composition for semiconductor substrate, comprising [I] a carbon radical generating agent, [II] an acid, [III] a reducing agent, and [IV] an organic solvent, and having pH of lower than 7 is used.

Effect of the Invention

The resist remover composition of the present invention enables to remove a resist simply and easily in the photolithography process in the semiconductor filed, and enables to remove a resist without giving an adverse effect to a silicon oxide film in the lower part of a resist, an implant layer, and further a metal wiring provided on a substrate, by using [I] a carbon radical generating agent, [II] an acid, [III] a reducing agent, and [IV] an organic solvent in combination.

In addition, the method for removing a resist of the present invention is an effective method to remove a resist simply and easily, and a method which is capable of removing a resist easily without giving an adverse effect to a silicon oxide film and the like in the lower part of the resist as mentioned above by using the removing agent having the above-described composition.

That is, the present inventors have intensively studied to achieve the above-described object. As a result, the present inventors have found that the resist can be removed by using a composition comprising at least [I] a carbon radical generating agent, [II] an acid, [III] a reducing agent, and [IV] an organic solvent. In addition, the present inventors have found that the resist can be removed without employing a method using a large or an expensive equipment such as plasma ashing, and further have found, for the first time, that not only the method is capable of removing a resist mildly and simply compared with a conventional dipping method using Caro's acid, but also the method can be applied to a substrate on which a metal wiring such as aluminum wiring has been provided, because a composition to dissolve a metal can be excluded from the composition of the present invention, and the present invention has been finally completed.

In addition, the present inventors have also found that since the carbon radical generating agent in the resist remover composition of the present invention hardly gives such an adverse effect that an oxide film is formed on the surface of metal wiring or the like compared with a compound which generates an oxygen radical such as hydrogen peroxide, ozone, the method is capable of removing a resist without giving an adverse effect to a metal wiring such as aluminum wiring.

Further, the present inventors have also found that the resist remover composition of the present invention not only has advantages such as easy handling, easy wastewater treatment, because it is not necessary to comprise a compound generating a fluorine ion (a fluoride ion) such as, for example, hydrogen fluoride or a salt thereof, and a corrosive action by hydrogen fluoride or the like does not occur, but also the composition of the present invention is particularly useful as a resist remover for a semiconductor substrate which has a risk of corrosion by hydrogen fluoride and the like such as, for example, a silicon substrate on which an oxide film (a silicon oxide film) has been formed.

DETAILED DESCRIPTION OF THE INVENTION

The [I] carbon radical generating agent in the resist remover composition for semiconductor substrate of the present invention includes a compound which suitably generates a carbon radical by heating or light irradiation. Specifically, the carbon radical generating agent includes a compound which suitably generates a carbon radical by heating including; azonitrile type carbon radical generating agent such as, for example, 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2-methylpropionamidine)dihydrochloride, 2,2'-azobis[N-(2-carboxyethyl)-2-methylpropionamidine]tetrahydrate; cyclic azoamidine type carbon radical generating agent such as, for example, 2,2'-azobis[2-(2-imidazoline-2-yl)propane]dihydrochloride, 2,2'-azobis[2-(2-imidazoline-2-yl)propane]disulfate, 2,2'-azobis[2-(2-imidazoline-2-yl)propane]dihydrate, 2,2'-azobis{2-[1-(2-hydroxyethyl)-2-imidazoline-2-yl]propane}dihydrochloride, 2,2'-azobis[2-(2-imidazoline-2-yl)propane], 2,2'-azobis(1-imino-1-pyrrolidino-2-methylpropane)dihydrochloride; azoester type carbon radical generating agent such as, for example, dimethyl-2,2'-azobis(2-methylpropionate); azonitrile carboxylic acid type carbon radical generating agent such as, for example, 4,4'-azobis(4-cyanovaleric acid); azoalkyl type carbon radical generating agent such as, for example, 2,2'-azobis(2,4,4-trimethylpentane); and macroazo type carbon radical generating agent such as, for example, dimethylpolysiloxane compound having an azo group in a molecule; and the like: and a compound which suitably generates a carbon radical by light irradiation such as, for example; benzoin alkyl ether type carbon radical generating agent such as, for example, benzoin methyl ether, benzoin ethyl ether, benzoin isopropyl ether, benzoin isobutyl ether; benzylketal type carbon radical generating agent such as, for example, 2,2-dimethoxy-1,2-diphenylethan-1-one; benzophenone type carbon radical generating agent such as, for example, benzophenone, 4,4'-bis(diethylamino)benzophenone, acrylated benzophenone, methyl benzoyl benzoate, 2-banzoylnaphthalene, 4-benzoyl biphenyl, 4-benzoyl diphenyl ether, 1,4-dibenzoylbenzene, [4-(methylphenylthio)phenyl]phenyl methane; aminobenzoate ester type carbon radical generating agent such as, for example, ethyl p-dimethylaminobenzoate ester, isoamyl ethyl p-dimethylaminobenzoate ester; 1,2-hydroxyalkylphenone type carbon radical generating agent such as, for example, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)benzyl]phenyl}-2-methylpropan-1-one, 1-hydroxycyclohexylphenylketone; 1,2-aminoalkylphenone type carbon radical generating agent such as, for example, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methyl phenyl)methyl]-1-[4-(4-morpholinyl)phenyl]-1-buta none; acylphosphine oxide type carbon radical generating agent such as, for example, 2,4,6-trimethylbenzoylphenylethoxyphosphine oxide, 2,4,6-trimethylbenzoyldiphenylphosphine oxide, bis(2,4,6-trimethylbenzoyl)phenylphosphine oxide; anthraquinone type carbon radical generating agent such as, for example, ethylanthraquinone; thioxanthone type carbon radical generating agent such as, for example, chlorothioxanthone, diethylthioxanthone, isopropylthioxanthone; acridone type carbon radical generating agent such as, for example, 10-butylchloroacridone; imidazole type carbon radical generating agent such as, for example, 2,2'-bis(o-chlorophenyl)-4,5,4',5'-tetraphenyl-1,2'-biimidazole, 2,2'-bis(o-chlorophenyl)-4,5,4',5'-tetrakis(3,4,5-trimethoxyphenyl)-1,2'-biimidazole; oxime ester type carbon radical generating agent such as, for example, 1,2-octandion-1-[4-(phenylthio)-2-(o-benzoyloxime)], ethanon-1-[9-ethyl-6-(2-methylbenzoyl)-9H-carbazol-3-yl]-1-(o-acetyloxime); titanocene type carbon radical generating agent such as, for example, bis(η5-2,4-cyclopentadiene-1-yl)-bis[2,6-difluoro-3-(1H-pyrrol-1-yl)phenyl]titanium; and the like. In addition, as for these carbon radical generating agents, a kind of compound may be used alone, or plural kinds of compounds may be used in an appropriate combination.

Among these [I] carbon radical generating agents, a compound which suitably generates a carbon radical by heating including, for example; azonitrile type carbon radical generating agent such as, for example, 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile), 1-[(1-cyano-1-methylethyl)azo]formamide; azoamide type carbon radical generating agent such as, for example, 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), 2,2'-azobis(N-cyclohexyl-2-methylpropionamide); chain-like azoamidine type carbon radical generating agent such as, for example, 2,2'-azobis(2- methylpropionamidine)dihydrochloride, 2,2'-azobis[N-(2-carboxyethyl)-2-methylpropionamidine]tetrahydrate; azoester type carbon radical generating agent such as, for example, dimethyl-2,2'-azobis(2-methylpropionate); and the like: and a compound which suitably generates a carbon radical by light irradiation of a wavelength of 200 to 750 nm including, for example; benzylketal type carbon radical generating agent such as, for example, 2,2-dimethoxy-1,2-diphenylethan-1-one; 1,2-hydroxyalkylphenone type carbon radical generating agent such as, for example, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)benzyl]phenyl}-2-methylpropan-1-one, 1-hydroxycyclohexylphenylketone, and the like; 1,2-aminoalkylphenone type carbon radical generating agent such as, for example, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methyl phenyl)methyl]-1-[4-(4-morpholinyl)phenyl]-1-buta none, are preferable.

It should be noted that among the above-described [I] carbon radical generating agents, some of the compounds which suitably generate a carbon radical by heating can generate a carbon radical also by light irradiation. Azonitrile type carbon radical generating agent, azoamide type carbon radical generating agent, chain-like azoamidine type carbon radical generating agent, cyclic azoamidine type carbon radical generating agent, azoester type carbon radical generating agent, and the like correspond to the compound which can generate a carbon radical also by light irradiation, and can generate a carbon radical by irradiation of light having a wavelength of 200 to 750 nm. That is, the compound which suitably generates a carbon radical by heating can generate a carbon radical usually only by heating, as mentioned below, but the compound which generates a carbon radical also by light irradiation such as the above-described azonitrile type carbon radical generating agent, azoamide type carbon radical generating agent, chain-like azoamidine type carbon radical generating agent, cyclic azoamidine type carbon radical generating agent, azoester type carbon radical generating agent, and the like may generate a carbon radical not only by a method of heating only, but also by a method of light irradiation only, or a method using heating and light irradiation in combination. On the other hand, the compound which suitably generates a carbon radical by light irradiation means a compound which can easily generate a carbon radical by light irradiation, and does not mean a compound which can not generate a carbon radical by heating. That is, the above-described compound which suitably generates a carbon radical by light irradiation can generate a carbon radical also by heating. As mentioned above, the compound which suitably generates a carbon radical by light irradiation can generate a carbon radical by light irradiation only, but also can generate a carbon radical only by heating or by combined use of heating and light irradiation. In addition, these preferable specific examples of the carbon radical generating agents are useful from the viewpoints of easy industrial availability, economic efficiency, efficient removing performance for a resist in a short time, and the like.

A function of the [I] carbon radical generating agent relevant to the present invention is not clear, but it is considered that the agent probably has a function to decompose a resist and the surface of a cured resist film, facilitate penetration of the organic solvent as mentioned below into inside of the resist, and facilitate dissolution of the resist and the like to the solvent.

The [II] acid in the resist remover composition for semiconductor substrate of the present invention is not particularly limited, so long as acid has a function to make pH of the solution acidic. Specifically, the [II] acid includes inorganic acid such as, for example, hydrochloric acid, nitric acid, sulfuric acid, phosphoric acid; organic acid including aliphatic monocarboxylic acid such as, for example, formic acid, acetic acid, trifluoroacetic acid, propionic acid, butyric acid, valeric acid, caproic acid, enanthic acid, caprylic acid, pelargonic acid, capric acid, lauric acid; aliphatic dicarboxylic acid such as, for example, oxalic acid, malonic acid, succinic acid, glutaric acid, adipic acid, pimelic acid, maleic acid, fumaric acid; aliphatic hydroxycarboxylic acid such as, for example, lactic acid, malic acid, tartaric acid, citric acid; aliphatic tricarboxylic acid such as, for example, aconitic acid; aliphatic oxocarboxylic acid such as, for example, pyruvic acid; aromatic monocarboxylic acid such as, for example, benzoic acid; aromatic dicarboxylic acid such as, for example, phthalic acid, isophthalic acid, terephthalic acid; aromatic hydroxycarboxylic acid such as, for example, salicylic acid, gallic acid; aromatic hexacarboxylic acid such as, for example, mellitic acid; and the like. In addition, the above-described [II] acid may be a form of salt, so long as it shows acidic property. A specific example of the acid salt includes ammonium salt, alkali metal salt such as, for example, sodium salt, potassium salt, and the like. In addition, as for these acids, one kind of acid may be used alone or plural kinds of acids may be used in an appropriate combination. It should be noted that for the sake of simple explanation, a carboxylic acid having one or more hydroxyl groups in the structure thereof should be classified to hydroxycarboxylic acid regardless of number of the carboxyl group.

Among these [II] acids, organic acid is preferable, above all, acetic acid, trifluoroacetic acid, oxalic acid, and citric acid are more preferable from the viewpoints that these acids have a character showing an appropriate acidity in a solution even a small amount of use together with industrial easy availability, economic efficiency, and the like. Usually an inorganic acid is often provided as an aqueous solution, and when such inorganic acid is used for a substrate on which a metal wiring has been provided, corrosion of the metal wiring may be caused due to the functions of a large quantity of water contained in the inorganic acid and the acid itself. Therefore, when such substrate is subjected to resist removing, it is desirable not to use an inorganic acid. Further, when an alkali metal salt of inorganic acid or organic acid is used for a substrate on which a metal wiring has been provided, deterioration of electrical characteristics on a semiconductor substrate may be caused. Therefore, when such substrate is subjected to resist removing, it is desirable not to use an alkali metal salt of inorganic acid or organic acid.

Although a function of the [II] acid relevant to the present invention is also not clear, it is considered that the [II] acid probably has a function to facilitate dissolution of a resist and a cured resist film in an organic solvent.

The [III] reducing agent in the resist remover composition for semiconductor substrate of the present invention is not particularly limited so long as the agent has a reducing efficiency, and includes a reducing agent which is commonly used in this field. Specifically, the reducing agent includes, for example, hydrazine or a derivative thereof; for example, hydroxylamine or a derivative thereof; sulfites such as, for example, sodium sulfite, ammonium sulfite; thiosulfites such as, for example, sodium thiosulfites, ammonium thiosulfites; aldehydes such as, for example, formaldehyde, acetoaldehyde; carboxylic acids having a reducing efficiency such as, for example, formic acid, oxalic acid, succinic acid, lactic acid, malic acid, citric acid, pyruvic acid; ascorbic acid derivative such as, for example, ascorbic acid or ascorbic acid ester, isoascorbic acid or isoascorbic acid ester; monosaccharide including pentose such as, for example, arabinose, xylose, ribose; hexose such as, for example, glucose, mannose, fructose, galactose; and the like. In addition, as for these reducing agents, one kind of compound may be used alone or plural kinds of compounds may be used in an appropriate combination. It should be noted that among the above-described reducing agents, a carboxylic acid having a reducing efficiency such as, for example, formic acid, oxalic acid, succinic acid, lactic acid, malic acid, citric acid, pyruvic acid, also exhibits an effect as an acid as mentioned above. Therefore, these carboxylic acids having a reducing efficiency can be used alone as two constituents of acid and reducing agent.

In the above-described derivatives, a specific example of the hydrazine derivative includes a compound such as, for example, hydrazine sulfate, hydrazine monohydrochloride, and the like. In addition, a specific example of the hydroxylamine derivative includes, for example, a hydroxylamine derivative represented by the general formula [1]:

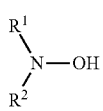
[1]

(wherein $R^1$ represents a linear, branched or cyclic C1-6 alkyl group, or a linear or branched C1-4 substituted alkyl group having 1 to 3 hydroxyl groups; $R^2$ represents a hydrogen atom, a linear, branched or cyclic C1-6 alkyl group, or a linear or branched C1-4 substituted alkyl group having 1 to 3 hydroxyl groups), and the like.

A specific example of the linear, branched or cyclic C1-6 alkyl group represented by $R^1$ and $R^2$ in the above-described general formula [1] includes, for example, a methyl group, an ethyl group, an n-propyl group, an isopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, a cyclohexyl group, and the like. Among them, an ethyl group, an n-propyl group and an n-butyl group are preferable, and above all, an ethyl group is more preferable.

A specific example of the linear or branched C1-4 substituted alkyl group having 1 to 3 hydroxyl groups represented by $R^1$ and $R^2$ in the general formula [1] includes, for example, a 1-hydroxyethyl group, a 2-hydroxyethyl group, a 1,2-dihydroxyethyl group, a 2,2-dihydroxyethyl group, a 1-hydroxy-n-propyl group, a 2-hydroxy-n-propyl group, a 3-hydroxy-n-propyl group, a 1,2-dihydroxy-n-propyl group, a 1,3-dihydroxy-n-propyl group, a 2,2-dihydroxy-n-propyl group, a 2,3-dihydroxy-n-propyl group, a 3,3-dihydroxy-n-propyl group, a 1,2,3-trihydroxy-n-propyl group, a 2,2,3-trihydroxy-n-propyl group, a 2,3,3-trihydroxy-n-propyl group, a 1-hydroxyisopropyl group, a 2-hydroxyisopropyl group, a 1,1-dihydroxyisopropyl group, a 1,2-dihydroxyisopropyl group, a 1,3-dihydroxyisopropyl group, a 1,2,3-trihydroxyisopropyl group, a 1-hydroxy-n-butyl group, a 2-hydroxy-n-butyl group, a 3-hydroxy-n-butyl group, a 4-hydroxy-n-butyl group, a 1,2-dihydroxy-n-butyl group, a 1,3-dihydroxy-n-butyl group, a 1,4-dihydroxy-n-butyl group, a 2,2-dihydroxy-n-butyl group, a 2,3-dihydroxy-n-butyl group, a 2,4-dihydroxy-n-butyl group, a 3,3-dihydroxy-n-butyl group, a 3,4-dihydroxy-n-butyl group, a 4,4-dihydroxy-n-butyl group, a 1,2,3-trihydroxy-n-butyl group, a 1,2,4-trihydroxy-n-butyl group, a 1,3,4-trihydroxy-n-butyl group, a 2,2,3-trihydroxy-n-butyl group, a 2,2,4-trihydroxy-n-butyl group, a 2,3,3-trihydroxy-n-butyl group, a 3,3,4-trihydroxy-n-butyl group, a 2,4,4-trihydroxy-n-butyl group, a 3,4,4-trihydroxy-n-butyl group, a 2,3,4-trihydroxy-n-butyl group, a 1-hydroxy-sec-butyl group, a 2-hydroxy-sec-butyl group, a 3-hydroxy-sec-butyl group, a 4-hydroxy-sec-butyl group, a 1,1-dihydroxy-sec-butyl group, a 1,2-dihydroxy-sec-butyl group, a 1,3-dihydroxy-sec-butyl group, a 1,4-dihydroxy-sec-butyl group, a 2,3-dihydroxy-sec-butyl group, a 2,4-dihydroxy-sec-butyl group, a 3,3-dihydroxy-sec-butyl group, a 3,4-dihydroxy-sec-butyl group, a 4,4-dihydroxy-sec-butyl group, a 1-hydroxy-2-methyl-n-propyl group, a 2-hydroxy-2-methyl-n-propyl group, a 3-hydroxy-2-methyl-n-propyl group, a 1,2-dihydroxy-2-methyl-n-propyl group, a 1,3-dihydroxy-2-methyl-n-propyl group, a 2,3-dihydroxy-2-methyl-n-propyl group, a 3,3-dihydroxy-2-methyl-n-propyl group, a 3-hydroxy-2-hydroxymethyl-n-propyl group, a 1,2,3-trihydroxy-2-methyl-n-propyl group, a 1,3,3-trihydroxy-2-methyl-n-propyl group, a 2,3,3-trihydroxy-2-methyl-n-propyl group, a 1,3-dihydroxy-2-hydroxymethyl-n-propyl group, a 2,3-dihydroxy-2-hydroxymethyl-n-propyl group, a 1-hydroxy-2-methyl isopropyl group, a 1,3-dihydroxy-2-methyl isopropyl group, a 1,3-dihydroxy-2-hydroxymethylisopropyl group, and the like. Among them, a 2,2-dihydroxyethyl group, a 2,3-dihydroxy-n-propyl group, and a 3,3-dihydroxy-n-propyl group are preferable, and among them, a 2,2-dihydroxyethyl group and a 2,3-dihydroxy-n-propyl group are more preferable.

A specific example of the above-described hydroxylamine derivative includes a compound which is commonly used in this field, and specifically includes, for example, hydroxylamine and hydroxylamine derivative including C1-6 mono- or di(bis)alkylhydroxylamine such as, for example, mono- or dimethylhydroxylamine, mono- or diethylhydroxylamine, mono- or di-n-propylhydroxylamine, mono- or diisopropylhydroxylamine, mono- or di-n-butylhydroxylamine, mono- or diisobutylhydroxylamine, mono- or di-sec-butylhydroxylamine, mono- or di-tert-butylhydroxylamine, mono- or dicyclobutylhydroxylamine, mono- or di-n-pentylhydroxylamine, mono- or diisopentylhydroxylamine, mono- or di-sec-pentylhydroxylamine, mono- or di-tert-pentylhydroxylamine, mono- or dineopentylhydroxylamine, mono- or di-2-methylbutylhydroxylamine, mono- or bis(1,2-dimethylpropyl)hydroxylamine, mono- or di-1-ethylpropylhydroxylamine, mono- or dicyclopentylhydroxylamine, mono- or di-n-hexylhydroxylamine, mono- or diisohexylhydroxylamine, mono- or di-sec-hexylhydroxylamine, mono- or di-tert-hexylhydroxylamine, mono- or dineohexylhydroxylamine, mono- or di-2-methylpentylhydroxylamine, mono- or bis(1,2-dimethylbutyl)hydroxylamine, mono- or bis(2,3-dimethylbutyl)hydroxylamine, mono- or di-1-ethylbutylhydroxylamine, mono- or dicyclohexylhydroxylamine; C1-4 mono- or bis(hydroxyalkyl)hydroxylamine such as, for example, mono- or bis(1-hydroxyethyl)hydroxylamine, mono- or bis(2-hydroxyethyl)hydroxylamine, mono- or bis(1,2-dihydroxyethyl)hydroxylamine, mono- or bis(2,2-dihydroxyethyl)hydroxylamine, mono- or bis(1-hydroxy-n-propyl)-1-hydroxylamine, mono- or bis(2-hydroxy-n-propyl)-1-hydroxylamine, mono- or bis(3-hydroxy-n-propyl)-1-hydroxylamine, mono- or bis(1,2-dihydroxy-n-propyl)-1-hydroxylamine, mono- or bis(1,3-dihydroxy-n-propyl)-1- hydroxylamine, mono- or bis(2,2-dihydroxy-n-propyl)-1-hydroxylamine, mono- or bis(2,3-dihydroxy-n-propyl)-1-hydroxylamine, mono- or bis(3,3-dihydroxy-n-propyl)-1-hydroxylamine, mono- or bis(1,2,3-trihydroxy-n-propyl)-1-hydroxylamine, mono- or bis(2,2,3-trihydroxy-n-propyl)-1-hydroxylamine, mono- or bis(2,3,3-trihydroxy-n-propyl)-1-hydroxylamine, mono- or bis(1-hydroxy-n-propyl)-2-hydroxylamine, mono- or bis(2-hydroxy-n-propyl)-2-hydroxylamine, mono- or bis(1,1-dihydroxy-n-propyl)-2-hydroxylamine, mono- or bis(1,2-dihydroxy-n-propyl)-2-hydroxylamine, mono- or bis(1,3-dihydroxy-n-propyl)-2-hydroxylamine, mono- or bis(1,2,3-trihydroxy-n-propyl)-2-hydroxylamine, mono- or bis(1-hydroxy-n-butyl)-1-hydroxylamine, mono- or bis(2-hydroxy-n-butyl)-1-hydroxylamine, mono- or bis(3-hydroxy-n-butyl)-1-hydroxylamine, mono- or bis(4-hydroxy-n-butyl)-1-hydroxylamine, mono- or bis(1,2-dihydroxy-n-butyl)-1-hydroxylamine, mono- or bis(1,3-dihydroxy-n-butyl)-1-hydroxylamine, mono- or bis(1,4-dihydroxy-n-butyl)-1-hydroxylamine, mono- or bis(2,2-dihydroxy-n-butyl)-1-hydroxylamine, mono- or bis(2,3-dihydroxy-n-butyl)-1-hydroxylamine, mono- or bis(2,4-dihydroxy-n-butyl)-1-hydroxylamine, mono- or bis(3,3-dihydroxy-n-butyl)-1-hydroxylamine, mono- or bis(3,4-dihydroxy-n-butyl)-1-hydroxylamine, mono- or bis(4,4-dihydroxy-n-butyl)-1-hydroxylamine, mono- or bis(1,2,3-trihydroxy-n-butyl)-1-hydroxylamine, mono- or bis(1,2,4-trihydroxy-n-butyl)-1-hydroxylamine, mono- or bis(1,3,4-trihydroxy-n-butyl)-1-hydroxylamine, mono- or bis(2,2,3-trihydroxy-n-butyl)-1-hydroxylamine, mono- or bis(2,2,4-trihydroxy-n-butyl)-1-hydroxylamine, mono- or bis(2,3,3-trihydroxy-n-butyl)-1-hydroxylamine, mono- or bis(3,3,4-trihydroxy-n-butyl)-1-hydroxylamine, mono- or bis(2,4,4-trihydroxy-n-butyl)-1-hydroxylamine, mono- or bis(3.4.4-trihydroxy-n-butyl)-1-hydroxylamine, mono- or bis(2,3,4-trihydroxy-n-butyl)-1-hydroxylamine, mono- or bis(1-hydroxy-n-butyl)-2-hydroxylamine, mono- or bis(2-hydroxy-n-butyl)-2-hydroxylamine, mono- or bis(3-hydroxy-n-butyl)-2-hydroxylamine, mono- or bis(1-hydroxy-n-butyl)-3-hydroxylamine, mono- or bis(1,1-dihydroxy-n-butyl)-2-hydroxylamine, mono- or bis(1,2-dihydroxy-n-butyl)-2-hydroxylamine, mono- or bis(1,3-dihydroxy-n-butyl)-2-hydroxylamine, mono- or bis(1,4-dihydroxy-n-butyl)-2-hydroxylamine, mono- or bis(2,3-dihydroxy-n-butyl)-2-hydroxylamine, mono- or bis(2,4-dihydroxy-n-butyl)-2-hydroxylamine, mono- or bis(1,1-dihydroxy-n-butyl)-3-hydroxylamine, mono- or bis(1,2-dihydroxy-n-butyl)-3-hydroxylamine, mono- or bis(2,2-dihydroxy-n-butyl)-3-hydroxylamine, mono- or bis(1-hydroxy-2-methyl-n-propyl)-1-hydroxylamine, mono- or bis(2-hydroxy-2-methyl-n-propyl)-1-hydroxylamine, mono- or bis(3-hydroxy-2-methyl-n-propyl)-1-hydroxylamine, mono- or bis (1,2-dihydroxy-2-methyl-n-propyl)-1-hydroxylamine, mono- or bis(1,3-dihydroxy-2-methyl-n-propyl)-1-hydroxylamine, mono- or bis(2,3-dihydroxy-2-methyl-n-propyl)-1-hydroxylamine, mono- or bis(3,3-dihydroxy-2-methyl-n-propyl)-1-hydroxylamine, mono- or bis(3-hydroxy-2-hydroxymethyl-n-propyl)-1-hydroxylamine, mono- or bis(1,2,3-trihydroxy-2-methyl-n-propyl)-1-hydroxylamine, mono- or bis(1,3,3-trihydroxy-2-methyl-n-propyl)-1-hydroxylamine, mono- or bis(2,3,3-trihydroxy-2-methyl-n-propyl)-1-hydroxylamine, mono- or bis(1,3-dihydroxy-2-hydroxymethyl-n-propyl)-1-hydroxylamine, mono- or bis(2,3-dihydroxy-2-hydroxymethyl-n-propyl)-1-hydroxylamine, mono- or bis(1-hydroxy-2-methyl-n-propyl)-2-hydroxylamine, mono- or bis(1,3-dihydroxy-2-methyl-n-propyl)-2-hydroxylamine, mono- or bis(1,3-dihydroxy-2-hydroxym-ethyl-n-propyl)-2-hydroxylamine; and C1-6 monoalkyl-mono(hydroxy-C1-4-alkyl)hydroxylamine such as, for example, ethyl hydroxymethylhydroxylamine, ethyl-2-hydroxyethylhydroxylamine, ethyl-1,2-dihydroxyethylhydroxylamine; and the like.

As for these hydroxylamine derivatives represented by the above-described general formula [1], a commercially available product may be used, or an appropriately synthesized product by a known method may be used, where, for example, an epoxide such as glycidol is added dropwise to an aqueous solution of hydroxylamine or monoalkyl-substituted hydroxylamine, and the solution is then reacted at an appropriate temperature.

A specific example of the above-described ascorbic acid ester includes a compound such as, for example, ascorbyl stearate, ascorbyl palmitate, ascorbyl dipalmitate, ascorbyl tetrahexyldecanoate, ascorbyl glucoside, and the like. In addition, a specific example of the above-described isoascorbic acid ester includes a compound such as, for example, isoascorbyl stearate, isoascorbyl palm itate, isoascorbyl dipalmitate, isoascorbyl tetrahexyldecanoate, isoascorbyl glucoside, and the like. Among ascorbic acid esters and isoascorbic acid esters, when ascorbic acid ester or isoascorbic acid ester containing alkali metal or alkaline-earth metal such as, for example, sodium ascorbate, ascorbic acid 2-sulfuric acid disodium salt, ascorbic acid 2-phosphoric acid disodium salt, ascorbic acid 2-phosphoric acid magnesium salt, sodium isoascorbate, isoascorbic acid 2-sulfuric acid disodium salt, isoascorbic acid 2-phosphoric acid disodium salt, isoascorbic acid 2-phosphoric acid magnesium salt, is used for a substrate on which a metal wiring has been provided, the alkali metal or the alkaline-earth metal may cause deterioration of electrical characteristics on a semiconductor substrate. Therefore, when such a substrate is subjected to removing a resist, it is desirable not to use ascorbic acid ester or isoascorbic acid ester containing alkali metal and the like.

Among these [III] reducing agents, ascorbic acid derivatives such as, for example, ascorbic acid or ascorbic acid ester, isoascorbic acid or isoascorbic acid ester, and the like are preferable from the viewpoints of an appropriate reducing efficiency, easy industrial availability, economic efficiency, and the like. Above all, hydroxylamine derivative, ascorbic acid, and ascorbic acid ester are more preferable, and above all, diethylhydroxylamine, bis(2,2-dihydroxyethyl)hydroxylamine, bis(2,3-dihydroxy-n-propyl)-1-hydroxylamine, ascorbic acid, and ascorbyl palmitate are further more preferable.

Although a function of the [III] reducing agent relevant to the present invention is also not clear, but it is considered that the reducing agent probably has a function to act chemically to a resist or a cured resist film, and change (denature) structure of a resist and a cured resist film to facilitate dissolution of the resist and the like in an organic solvent.

The [VI] organic solvent in the resist remover composition for semiconductor substrate of the present invention includes an organic solvent which is commonly used in this field. Specifically, the solvent includes alcohol type protic polar organic solvent such as, for example, methanol, ethanol, n-propanol, isopropanol, n-butanol, tert-butanol, 1-methoxy-2-propanol, ethylene glycol; aprotic polar organic solvent including ester type solvent such as, for example, ethyl acetate, n-propyl acetate, isobutyl acetate, ethyl lactate, diethyl oxalate, diethyl tartrate, γ-butyrolactone; amide type solvent such as, for example, dimethylformamide, N-methylpyrrolidone; sulfoxide type solvent such as, for example, dimethylsulfoxide; nitrile type solvent such as, for example, acetonitrile; and the like. Among these [VI] organic solvents, isopropanol, ethylene glycol, γ-butyrolactone and N-methylpyrolidone, which are capable of removing a resist in a short time are preferable, and above all, isopropanol, γ-butyrolactone and N-methylpyrolidone are more preferable. In addition, as for these organic solvent, one kind of solvent may be used alone or plural kinds of solvents may be used in an appropriate combination. As an organic solvent in the resist remover composition for semiconductor substrate of the present invention, a combination of isopropanol and γ-butyrolactone and a combination of isopropanol and N-methylpyrolidone are particularly preferable.

A function of the [IV] organic solvent relevant to the present invention is to dissolve a resist and a cured resist film in the organic solvent, and to remove the resist and the cured resist film.

In addition, the resist remover composition for semiconductor substrate of the present invention may comprise [V] water, besides the above-described constituents. By comprising water, more easy removing a resist becomes possible by assisting dissolution of a reducing agent and the like which are difficult to dissolve in an organic solvent, and allowing the reducing agent to exert reducing efficiency and the like smoothly.

The above-described [V] water is not particularly limited, so long as the water does not give an adverse effect to removing a resist. The water includes, for example, common water, purified water such as, for example, distilled water, deionized water, and ultrapure water, and the like, and among them, ultrapure water is preferable. Since ultrapure water contains little impurity, it can be suitably used for a substrate on which a metal wiring such as aluminum wiring and the like has been provided.

Further, the resist remover composition for semiconductor substrate of the present invention may comprise [VI] a surfactant, besides the above-described constituents. By comprising a surfactant, more easy removing a resist becomes possible by assisting dissolution of reducing agent and the like which are difficult to dissolve in an organic solvent, and allowing the reducing agent to exert reducing efficiency and the like smoothly.

The above-described [VI] surfactant may be a surfactant which is commonly used in this field, and specifically includes, for example, a cationic surfactant, an anionic surfactant, a nonionic surfactant, an ampholytic surfactant, and the like. The cationic surfactant specifically includes primary to tertiary alkylamine salts such as, for example, monostearylammonium chloride, distearylammonium chloride, tristearylammonium chloride; quaternary alkylammonium salts such as, for example, monostearyltrimethylammonium chloride, distearyldimethylammonium chloride, stearyldimethylbenzylammonium chloride, monostearyl-bis(polyethoxy)methylammonium chloride; alkylpyridinium salts such as, for example, N-cetylpyridinium chloride, N-stearylpyridinium chloride; N,N-dialkylmorpholinium salts such as, for example, cetylethylmorpholinium ethosulfate, 4-(4,6-dimethoxy-1,3,5-triazin-2-yl)-4-methylmorpholinium chloride; fatty acid amide salts such as, for example, polyethylene polyamine; and the like. In addition, the anionic surfactant specifically includes anionic surfactants having a carboxyl group in a molecule such as, for example, sodium alkylcarboxylate salt, potassium alkylcarboxylate salt, ammonium alkylcarboxylate salt, sodium alkylbenzenecarboxylate salt, potassium alkylbenzenecarboxylate salt, ammonium alkylbenzenecarboxylate salt, sodium polyoxyalkylene alkylethercarboxylate salt, potassium polyoxyalkylene alkylethercarboxylate salt, ammonium polyoxyalkylene alkylethercarboxylate salt, sodium N-acylsarcosine salt, potassium N-acylsarcosine salt, ammonium N-acylsarcosine salt, sodium N-acylglutamate salt, potassium N-acylglutamate salt, ammonium N-acylglutamate salt; anionic surfactants having a sulfonate group in a molecule such as, for example, sodium alkylsulfonate salt, potassium alkylsulfonate salt, ammonium alkylsulfonate salt, sodium alkylbenzenesulfonate salt, potassium alkylbenzenesulfonate salt, ammonium alkylbenzenesulfonate salt, sodium alkylnaphthalenesulfonate salt, potassium alkylnaphthalenesulfonate salt, ammonium alkylnaphthalenesulfonate salt, sodium polyoxyalkylene alkylethersulfonate salt, potassium polyoxyalkylene alkylethersulfonate salt, ammonium polyoxyalkylene alkylethersulfonate salt, sodium N-methyl-N-acyltaurate salt, potassium N-methyl-N-acyltaurate salt, ammonium N-methyl-N-acyltaurate salt, sodium dialkylsulfosuccinate salt, potassium dialkylsulfosuccinate salt, ammonium dialkylsulfosuccinate salt; anionic surfactants having a phosphonate group in a molecule such as, for example, sodium alkylphosphonate salt, potassium alkylphosphonate salt, ammonium alkylphosphonate salt, sodium alkylbenzenephosphonate salt, potassium alkylbenzenephosphonate salt, ammonium alkylbenzenephosphonate salt, sodium polyoxyalkylene alkyletherphosphonate salt, potassium polyoxyalkylene alkyletherphosphonate salt, ammonium polyoxyalkylene alkyletherphosphonate salt; and the like. Further, the nonionic surfactant specifically includes polyoxyethylene alkyl ethers such as, for example, polyoxyethylene stearyl ether; polyoxyethylene alkenyl ethers such as, for example, polyoxyethylene oleyl ether; polyoxyalkylene alkylphenyl ethers such as, for example, polyoxyethylene nonylphenyl ether; polyoxyalkylene glycols such as, for example, polyoxypropylene polyoxyethylene glycol; polyoxyethylene monoalkylates such as, for example, polyoxyethylene monostearate; bispolyoxyethylene alkylamines such as, for example, bispolyoxyethylene stearylamine; bispolyoxyethylene alkylamides such as, for example, bispolyoxyethylene stearylamide; alkylamine oxides such as, for example, N,N-dimethylalkylamine oxide; and the like. Still further, the amphoteric surfactant specifically includes carboxybetaines such as, for example, alkyl-N,N-dimethylaminoacetic acid betaine, alkyl-N,N-dihydroxyethylaminoacetic acid betaine; sulfo betaines such as, for example, alkyl-N,N-dimethylsulfoethyleneammonium betaine; imidazolinium betaines such as, for example, 2-alkyl-N-carboxymethyl-N-hydroxyethylimidazolinium betaine; and the like. In addition, as for these surfactants, one kind of surfactant may be used alone or plural kinds of surfactants may be used in an appropriate combination.

The resist remover composition for semiconductor substrate of the present invention can remove a resist only by comprising the [II] acid to make pH less than 7. Further, in the acidic pH range, pH in a range of 0 to 4 is preferable, and above all, pH in a range of 0 to 2 is more preferable. By setting pH in such a preferable range, it becomes possible to remove a resist in a shorter time and more effectively. It should be noted that pH may be set by appropriately adjusting kind, concentration, and the like of the above-described acid so that pH falls within the above-described range.

The resist remover composition for semiconductor substrate of the present invention comprises [I] a carbon radical generating agent, [II] an acid, [III] a reducing agent, and [IV] an organic solvent, but may further comprise [V] water in addition to the above-described constituents. In addition, the resist remover composition for semiconductor substrate of the present invention is in a form of a solution in an organic solvent or a mixed solvent of an organic solvent and water, and is prepared by dissolving the carbon radical generating agent, the acid and the reducing agent relevant to the present invention as mentioned above in an organic solvent or a mixed solvent of an organic solvent and water.

In the resist remover composition for semiconductor substrate of the present invention, concentration in percent by weight of each constituent in the composition comprising, besides the essential constituents, further water, that is, concentrations in % by weight of the [I] carbon radical generating agent, the [II] acid, the [III] reducing agent, the [IV] organic solvent, and the [V] water will be explained as follows.

In the resist remover composition for semiconductor substrate of the present invention, concentration in percent by weight of the [I] carbon radical generating agent is generally 0.1 to 10% by weight, and preferably 0.5 to 10% by weight based on a weight of the carbon radical generating agent to the total weight of the composition. When concentration of the above-described carbon radical generating agent to be used is too low, there is a problem that the carbon radical required for removing a resist inevitably becomes insufficient, and resist can be hardly removed sufficiently.

In the resist remover composition for semiconductor substrate of the present invention, concentration in percent by weight of the [II] acid is generally 0.1 to 5% by weight, and preferably 0.5 to 5% by weight based on a weight of the acid to the total weight of the composition. When concentration of the above-described acid to be used is too low, there is a problem that pH of the composition becomes too high, and resist can be hardly removed in a shorter time and effectively.

In the resist remover composition for semiconductor substrate of the present invention, concentration in percent by weight of the [III] reducing agent is generally 0.01 to 10% by weight, and preferably 0.1 to 5% by weight based on a weight of the reducing agent to the total weight of the composition. When concentration of the above-described reducing agent to be used is too low, there is a problem that resist can be hardly removed sufficiently.

In the resist remover composition for semiconductor substrate of the present invention, concentration in percent by weight of the [IV] organic solvent is generally 60 to 99% by weight, and preferably 70 to 99% by weight based on a weight of the organic solvent to the total weight of the composition. When concentration of the above-described organic solvent to be used is too low, there is a problem that resist can be hardly removed sufficiently, or a resist residue once removed adheres to a substrate again.

In the resist remover composition for semiconductor substrate of the present invention, concentration in percent by weight of the [V] water is generally 0.01 to 30% by weight, and preferably 0.01 to 20% by weight based on a weight of the water to the total weight of the composition. When concentration of the above-described water to be used is too high, there is a problem that corrosion of a metal wiring such as aluminum wiring and the like provided on a substrate is caused. For this reason, when the substrate as a target of resist removing is one on which a metal wiring has been provided, it is desirable that content of water is as low as possible.

The resist remover composition for semiconductor substrate of the present invention may comprise, besides the [I] carbon radical generating agent, the [II] acid, the [III] reducing agent, the [IV] organic solvent, the [V] water, and the [VI] surfactant relevant to the present invention as mentioned above, various kinds of auxiliary components within a range where the effect of the present invention is not impaired.

A specific example of various kinds of auxiliary components includes, for example, metal corrosion inhibitor which is used for the purpose to protect a metal wiring and inhibit corrosion, and the like.

A specific example of the metal corrosion inhibitor includes, for example, benzotriazole; benzotriazole derivatives such as, for example, carboxybenzotriazole, aminobenzotriazole; thioureas such as, for example, thiourea; thiol compound such as, for example, mercaptothiazole, mercaptoethanol, thioglycerol; carboxylic acid derivatives such as, for example, quinolinecarboxylic acid; and the like. In addition, as for these metal corrosion inhibitors, one kind of metal corrosion inhibitor may be used alone or plural kinds of metal corrosion inhibitors may be used in an appropriate combination.

Concentration of the auxiliary component to be appropriately added to the resist remover composition for semiconductor substrate of the present invention may be a concentration in a range where these auxiliary components are commonly used. Specifically, for example, concentration in percent by weight of the metal corrosion inhibitor is generally 0.01 to 5% by weight based on a weight of the metal corrosion inhibitor to the total weight of the composition.

A method for preparing the resist remover composition for semiconductor substrate of the present invention may be a method by which a solution containing the constituents relevant to the present invention as mentioned above can be finally prepared. Specifically, for example, (1) a method where the [I] carbon radical generating agent, the [II] acid, the [III] reducing agent, and the [VI] surfactant if necessary, relevant to the present invention, are added directly to the [IV] organic solvent, and stirred and dissolved; (2) a method where each of the [I] carbon radical generating agent, the [II] acid, the [III] reducing agent, and the [VI] surfactant if necessary, relevant to the present invention, is added separately to the [IV] organic solvent, and the organic solvent solutions are mixed; (3) a method where the [I] carbon radical generating agent, the [II] acid, the [III] reducing agent, and the [VI] surfactant if necessary, relevant to the present invention, are added directly to a mixed solvent of the [IV] organic solvent and the [V] water, and stirred and dissolved; (4) a method where an aqueous solution of the [II] acid, the [III] reducing agent, and the [VI] surfactant if necessary, relevant to the present invention is added to a solution of the [I] carbon radical generating agent relevant to the present invention in the [IV] organic solvent; and the like are included. Among them, the method of (4) is a preferable method from the viewpoint of easy pH adjustment because an aqueous solution containing an acid is added in the last step. It should be noted that since the resist remover composition for semiconductor substrate of the present invention contains a carbon radical generating agent, it is desirable to prepare the composition under illumination where a light having a specified region of wavelength required for the carbon radical generating agent to generate a carbon radical has been cut out like yellow lamp or the like, in dark place, and at a low temperature such as room temperature or lower, and the like.

Next, in the resist remover composition for semiconductor substrate of the present invention, a preferable specific example of a resist as a target to be removed and a preferable specific example of a semiconductor substrate will be explained.

In the resist remover composition for semiconductor substrate of the present invention, a resist as a target to be removed is so-called a photoresist film formed from a resist material containing an organic polymer compound. The resist is not particularly limited and may be any one of for g-line, for i-line, for excimer laser such as KrF, ArF, for electron beam, and for X-ray. In addition, the resist also includes a film denatured by heat and a film of which the surface has been cured, for example, by plasma doping of boron, phosphorus, and the like. As mentioned above, the resist remover composition for semiconductor substrate of the present invention is a superior remover which is capable of removing not only a resist but also a cured resist film generated by the plasma doping.

In the resist remover composition for semiconductor substrate of the present invention, a specific example of the semiconductor substrate as a target includes, for example, silicon substrate, GaAs substrate, GaP substrate, and the like. Among them, silicon substrate is preferable, and further, among the silicon substrates, a silicon substrate in which an oxide film (a silicon oxide film) has been formed on the surface of the substrate is preferable. It should be noted that oxide film here means thermal oxide film, TEOS oxide film, and the like.

In the resist remover composition for semiconductor substrate of the present invention, the semiconductor substrate as a target may be a semiconductor substrate as mentioned above such as silicon substrate, on which at least a resist has been formed, among them, a silicon substrate on which an oxide film has been formed and a resist has been formed on the oxide film is preferable, and above all, a silicon substrate on which an oxide film has been formed which has been subjected to plasma doping is more preferable.

In addition, a semiconductor substrate as a target may be one on which a metal wiring has been provided. Among them, a semiconductor substrate on which a metal wiring has been provided is preferable, above all, a silicon substrate on which a metal wiring has been provided is more preferable, and further above all, a silicon substrate on which an oxide film (a silicon oxide film) has been formed and a metal wiring has been provided thereon is particularly preferable. A specific example of the metal wiring includes, for example, aluminum wiring, tungsten wiring, copper wiring, aluminum alloy wiring, tungsten alloy wiring, aluminum-copper alloy wiring, and the like. Since the resist remover composition for semiconductor substrate of the present invention can be a composition which contains a small amount of water or no water at all, or a composition which does not contain a compound generating an oxygen radical (oxygen radical generating agent) such as hydrogen peroxide which has a potential risk of an adverse effect such as oxidation of the surface of metal wiring, the composition is a superior remover which is capable of removing a resist, without corroding such metal wiring even when a substrate on which a metal wiring has been provided is used.

As mentioned above, since the resist remover composition for semiconductor substrate of the present invention is one which is suitably used for a silicon substrate on which an oxide film has been formed on the surface, it is desirable that the composition contains substantially no fluorine source to dissolve a silicon oxide film such as, for example, hydrogen fluoride or a salt thereof, that is, no compound to generate a fluorine ion (a fluoride ion). In addition, by containing substantially no compound to generate such a highly corrosive fluorine ion (fluoride ion) in the resist remover composition for semiconductor substrate of the present invention, such effects can be expected that handling of the composition becomes easy, wastewater treatment becomes easy, and the like. It should be noted that "substantially" here means an amount which has a potential risk to give an adverse effect to a silicon oxide film like that the silicon oxide film is dissolved or the like, and does not mean to exclude a commingling of an infinitesimal amount like a level of impurity.

Next, preferable means of a method for removing a resist by treating a semiconductor substrate on which a resist has been formed using the resist remover composition for semiconductor substrate of the present invention will be explained.

Firstly, as the resist remover composition for semiconductor substrate of the present invention, a solution of the composition which is prepared by dissolving the constituents relevant to the present invention as mentioned above by the method as mentioned above in each prescribed concentration range is arranged. Subsequently, removing of a resist is achieved by appropriately employing, for example, a method where the above-described semiconductor substrate is dipped while the solution is irradiated by a light (active energy ray) having a prescribed wavelength; a method where the above-described semiconductor substrate is dipped while the solution is heated at a prescribed temperature; a method where the above-described semiconductor substrate is dipped while the above-described light irradiation and the above-described heating are used in combination, and the like.

In the case when a light (active energy ray) having a prescribed wavelength is irradiated, a preferable wavelength of the light (active energy ray) is generally a wavelength of 200 to 750 nm, and preferably a wavelength of 200 to 450 nm. By irradiating a light (active energy ray) having a wavelength in such a preferable range to the resist remover composition for semiconductor substrate of the present invention, the carbon radical is efficiently generated from the carbon radical generating agent relevant to the present invention, and the resist becomes to be removed in a shorter time and effectively.

In the case when the solution is heated to a prescribed temperature, a preferable temperature in the heating is generally 30 to 90° C., and preferably 40 to 80° C. By heating the resist remover composition for semiconductor substrate of the present invention to a temperature in such a preferable range, the carbon radical is efficiently generated from the carbon radical generating agent relevant to the present invention, and the resist becomes to be removed in a shorter time and effectively.

In the case when a semiconductor substrate is dipped into the resist remover composition for semiconductor substrate of the present invention which is irradiated with a light (active energy ray) having the wavelength as mentioned above [the composition with only light irradiation], the resist remover composition for semiconductor substrate of the present invention which is heated to a prescribed temperature as mentioned above [the composition with only heating], or the resist remover composition for semiconductor substrate of the present invention which is irradiated with a light (active energy ray) having the wavelength as mentioned above while the solution is heated to a prescribed temperature as mentioned above [the composition with light irradiation and heating in combination], a dipping time is preferably 1 to 60 minutes, more preferably 1 to 50 minutes, and further more preferably 1 to 40 minutes.

Among these methods as mentioned above, the method by only light irradiation is a preferable method having such advantages that carbon radical generation from the carbon radical generating agent can be more easily controlled, adverse effect is hardly given to a semiconductor substrate, and more advantageous in cost-performance ratio, compared with the method by only heating or the method by using heating in combination. For this reason, when a resist is removed, it is desirable to employ the method in which the resist remover composition for semiconductor substrate of the present invention is irradiated with a light (active energy ray) having such a preferable wavelength as mentioned above but is not heated. It should be noted that when a resist is required to be removed in a shorter time and efficiently, or the like, the resist remover composition for semiconductor substrate of the present invention using light irradiation and heating in combination may be sometimes desirable.

A specific example of the above-described dipping method includes a known dipping method including, for example, a method in which a semiconductor substrate is simply placed in the resist remover composition for semiconductor substrate of the present invention throughout the dipping; for example, a method in which a semiconductor substrate is dipped while the composition is oscillated; for example, a method in which a semiconductor substrate is dipped while the resist remover composition for semiconductor substrate of the present invention is stirred; and, for example, a method in which a semiconductor substrate is dipped while the resist remover composition for semiconductor substrate of the present invention is bubbled with an inert gas such as nitrogen gas; a method in which a semiconductor substrate is dipped while the semiconductor substrate is transferred; for example, a method in which a semiconductor substrate is dipped while the semiconductor substrate is transferred by means of a transferring device such as conveyor; and the like, and any one of these dipping methods may be employed.

Since each of the methods for removing a resist as mentioned above is just an example, other method may be also employed. For example, in the case of the dipping method with light irradiation, a method in which a semiconductor substrate is dipped in the resist remover composition for semiconductor substrate of the present invention which has been irradiated by light before the dipping in advance but is not irradiated with light during the dipping may be employed. In addition, for example, in the case of the dipping method with heating, a method in which a semiconductor substrate is dipped in the resist remover composition for semiconductor substrate of the present invention which has been set at a prescribed temperature before the dipping in advance but is not heated during the dipping may be employed. Further, the methods for removing a resist by dipping were described here, but besides the methods by dipping, a method in which the resist remover composition for semiconductor substrate of the present invention which has been appropriately heated or/and irradiated with light is coated or sprayed on the semiconductor substrate, and the like may be employed. It should be noted that equipment required for light irradiation, heating, dipping, stirring, bubbling, coating, spraying, and the like may be one which is commonly used in this field.

As mentioned above, the method for removing a resist of the present invention is a superior method which is capable of removing a resist under mild conditions such as light irradiation, heating, without employing the plasma ashing which had been carried out conventionally. In addition, since the resist remover composition for semiconductor substrate of the present invention can be a composition which does not contain a compound generating a fluorine ion (a fluoride ion) which is a component to dissolve a silicon oxide film and a metal, the method is a superior method which is capable of applying even to a silicon substrate on which a silicon oxide film has been formed or a semiconductor substrate on which a metal wiring has been provided.

EXAMPLES

Hereinafter, the present invention is specifically explained based on Examples and Comparative Examples, but the present invention is not limited by these Examples. It should be noted that percent in the following Examples and Comparative Examples is based on weight (w/w %) unless otherwise noted.

A resist film having a thickness of 200 nm was formed on a substrate of a silicon wafer having a diameter of 300 mm on which an oxide film has been formed. This substrate was subjected to plasma doping with boron to cure the surface of the resist film to prepare a substrate with a cured resist film. Subsequently, the substrate was cut to slips of 20 mm×20 mm to prepare a substrate for evaluation.

Example 1

Preparation of Resist Remover Composition for Semiconductor Substrate of the Present Invention (1)

To a solution of γ-butyrolactone (80 g) in an organic solvent, dimethyl-2,2'-azobis(2-methylpropionate) (V-601; produced by Wako Pure Chemical Industries, Ltd.) (1 g) was added under irradiation by yellow lamp (straight-tube type yellow fluorescent lamp, FLR$^{40}$SY-IC/M; manufactured by Mitsubishi Electric Osram Ltd.), and the solution was stirred at room temperature. After confirming dissolution of V-601, the total volume of an aqueous solution of ascorbic acid (0.5 g) and citric acid (3 g) dissolved in water (15.5 g) in advance was added to the solution while stirring was continued, to prepare composition of the present invention (1) which showed pH 2.

Examples 2 to 10

Preparation of Resist Remover Composition for Semiconductor Substrate of the Present Invention (2) to (10)

In Examples 2 to 10, compositions of the present invention (2) to (10) were prepared in the same method as in Example 1, except that each constituent as shown in Table 1 was used in an amount as shown in Table 1. These compositions are shown in Table 1 together with the composition of Example 1. It should be noted that numerals shown in Table 1 mean concentrations in percent by weight of each component based on the total weight of the composition as 100%.

TABLE 1

| | | Example | | | | | | | | | |
|---|---|---|---|---|---|---|---|---|---|---|---|
| | | 1 | 2 | 3 | 4 | 5 | 6 | 7 | 8 | 9 | 10 |
| Composition of the present invention | | (1) | (2) | (3) | (4) | (5) | (6) | (7) | (8) | (9) | (10) |
| Carbon radical generating agent | V-601 | 1 | 1 | 5 | 5 | 5 | | | 5 | 5 | |
| | VA-086 | | | | | | 5 | | | | |
| | AIBN | | | | | | | 5 | | | |
| | Irgacure 369 | | | | | | | | | | 2 |
| Acid | Citric acid | 3 | | 3 | | | | | | | |
| | TFA | | 1 | | 1 | 1 | 1 | 1 | 1 | 1 | 1 |

TABLE 1-continued

| | | Example | | | | | | | | | |
|---|---|---|---|---|---|---|---|---|---|---|---|
| Composition of the present invention | | 1 (1) | 2 (2) | 3 (3) | 4 (4) | 5 (5) | 6 (6) | 7 (7) | 8 (8) | 9 (9) | 10 (10) |
| Reducing agent | Ascorbic acid | 0.5 | 0.5 | 0.5 | 0.5 | 0.5 | 0.5 | 0.5 | | | 0.5 |
| | Ascorbyl palmitate | | | | | | | | 0.5 | | |
| | Bis-2,3-dihydroxy-n-propylhydroxylamine | | | | | | | | | 0.5 | |
| Organic solvent | γ-Butyrolactone | 80 | 80 | 80 | 80 | | 80 | 80 | 80 | 80 | 80 |
| | N-Methylpyrolidone | | | | | 80 | | | | | |
| | Isopropanol | | | | | | | | 13.5 | | |
| Water | Water | 15.5 | 17.5 | 11.5 | 13.5 | 13.5 | 13.5 | 13.5 | | 13.5 | 16.5 |
| pH | | 2 | 0.4 | 2 | 0.4 | 0.4 | 0.4 | 0.4 | 0.4 | 0.4 | 0.4 |

V-601: Dimethyl-2,2'-azobis(2-methypropionate)
VA-086: 2,2'-Azobis[2-methyl-N-(2-hydroxyethyl)propionamide
AIBN: 2,2'-Azobis(2-methylpropionitrile)
Irgacure 369: 2-Benzyl-2-dimethylamino-1-(4-morpholinophenyl)-butanone-1
TFA: Trifluoroacetic acid Comparative Example 1

Preparation of Composition for Comparison (1)

To a mixed solvent of γ-butyrolactone (80 g) and water (16.5 g), ascorbic acid (0.5 g) was added, after that, citric acid (3 g) was further added thereto, to prepare composition for comparison (1) which showed pH 2.

Comparative Examples 2 to 5

Preparation of Compositions for Comparison (2) to (5)

In Comparative Example 2, composition for comparison (2) was prepared in the same method as in Comparative Example 1, except that each constituent as shown in Table 2 was used in an amount as shown in Table 2. In addition, in Comparative Examples 3 to 5, compositions for comparison (3) to (5) were prepared in the same method as in Example 1, except that various kinds of bases shown in Table 2 were used in amounts as shown in Table 2 instead of the acid relevant to the present invention. These compositions are shown in Table 2 together with the composition of Comparative Example 1. It should be noted that numerals shown in Table 2 mean concentrations in percent by weight of each constituent based on the total weight of the composition as 100%.

TABLE 2

| | | Comparative Example | | | | |
|---|---|---|---|---|---|---|
| Composition for comparison | | 1 (1) | 2 (2) | 3 (3) | 4 (4) | 5 (5) |
| Carbon radical generating agent | V-601 | | | 5 | 5 | 5 |
| Acid or Base | Citric acid | 3 | 3 | | | |
| | TMAH | | | 3 | | |
| | TBAH | | | | 3 | |
| | Pyridine | | | | | 3 |
| Reducing agent | Ascorbic acid | 0.5 | 3 | 0.5 | 0.5 | 0.5 |
| Organic solvent | γ-Butyrolactone | 80 | 80 | 80 | 80 | 80 |
| Water | Water | 16.5 | 14 | 11.5 | 11.5 | 11.5 |
| pH | | 2 | 2 | 10 | 10 | 8 |

V-601: Dimethyl-2,2'-azobis(2-methypropionate)
TMAH: Tetramethylammonium hydroxide
TBAH: Tetrabutylammonium hydroxide Example 11

Evaluation of Resist Remover Composition for Semiconductor Substrate of the Present Invention (1)

After composition of the present invention (1) (100 mL) prepared in Example 1 was heated to 60° C., the above-described substrate for evaluation was dipped for 30 minutes under gentle stirring, while the composition was maintained at 60° C. as it was. After that, the substrate was rinsed with pure water for 30 seconds, and then the substrate surface was dried with compressed air. The substrate after drying was observed by visual check, and it was confirmed that a resist had been well removed. As a result, it could be confirmed that by dipping the substrate for evaluation in the heated composition of the present invention for 30 minutes under stirring, not only a resist film but also a cured resist film could be removed.

Examples 12 to 19

Evaluations of Resist Remover Compositions for a Semiconductor Substrate of the Present Invention (2) to (9)

In Examples 12 to 19, dipping for a prescribed time in each of resist remover compositions for a semiconductor substrate of the present invention (2) to (9) was carried out in the same method as in Example 11, and removing performances for a resist was observed by visual check. Results of these evaluations are shown in Table 3 together with results of Example 11.

TABLE 3

| Example | Composition of the present invention | Dipping time | Removing performance |
|---|---|---|---|
| 11 | (1) | 30 min | ⊚ |
| 12 | (2) | 30 min | ⊚ |
| 13 | (3) | 30 min | ⊚ |
| 14 | (4) | 20 min | ⊚ |
| 15 | (5) | 20 min | ⊚ |
| 16 | (6) | 30 min | ⊚ |
| 17 | (7) | 30 min | ⊚ |

TABLE 3-continued

| Example | Composition of the present invention | Dipping time | Removing performance |
|---------|--------------------------------------|--------------|----------------------|
| 18 | (8) | 20 min | ◎ |
| 19 | (9) | 30 min | ◎ |

◎: Removed in a degree of 90% or more
○: Removed in a degree of 60% or more but less than 90%
Δ: Removed in a degree of 30% or more but less than 60%
X: Removed in a degree of less than 30%

Example 20

Evaluation of Resist Remover Composition for Semiconductor Substrate of the Present Invention (10)

In composition of the present invention (10) (100 mL) prepared in Example 10, the above-described substrate for evaluation was dipped for 20 minutes at room temperature under gentle stirring, while the composition was irradiated with a light having a central wavelength of 320 nm using a ultraviolet irradiation equipment (UV irradiation equipment, MUV-35U with MUV-PF001 filter; manufactured by Moritex Corp.). After that, the substrate was rinsed with pure water for 30 seconds, and then the substrate surface was dried with compressed air. The substrate after drying was observed by visual check, and it was confirmed that a resist had been well removed. As a result, it could be confirmed that by dipping the substrate for evaluation in the composition of the present invention for 20 minutes under stirring and light irradiation, not only a resist film but also a cured resist film could be removed.

Comparative Examples 6 to 10

Evaluation of Compositions for Comparison (1) to (5)

In comparative Examples 6 to 10, dipping for 30 minutes in each of compositions for comparison (1) to (5) was carried out in the same method as in Example 11. However, a resist could be hardly removed in any composition for comparison. These results are shown in Table 4.

TABLE 4

| Comparative Example | Composition for comparison | Dipping time | Removing performance |
|---------------------|----------------------------|--------------|----------------------|
| 6 | (1) | 30 min | X |
| 7 | (2) | 30 min | X |
| 8 | (3) | 30 min | X |
| 9 | (4) | 30 min | X |
| 10 | (5) | 30 min | X |

◎: Removed in a degree of 90% or more
○: Removed in a degree of 60% or more but less than 90%
Δ: Removed in a degree of 30% or more but less than 60%
X: Removed in a degree of less than 30%

From the results of Examples 11 to 19, it was found that in any composition containing a compound which suitably generated a carbon radical by heating (thermal radical generating agent) as the carbon radical generating agent, a resist with a cured film could be well removed. In addition, from the results of Example 20, it was found that also in the case when a compound which suitably generated a carbon radical by light (photo radical generating agent) was used instead of the thermal radical generating agent as the carbon radical generating agent and the carbon radical was generated from the carbon radical generating agent by light irradiation, a resist with a cured film could be well removed.

On the other hand, from the results of Comparative Examples 6 to 10, it was found that since a resist could not be removed without using the carbon radical generating agent, the carbon radical generating agent was an essential constituent for the composition relevant to the present invention, and that a combination of a carbon radical generating agent, an acid, a reducing agent, and an organic solvent was important. In addition, it was also found that since a composition where a base was used instead of an acid and pH was adjusted to be basic could not remove a resist, it was necessary to keep pH of the solution acidic.

Example 21

Evaluation of Aluminum Elusion from an Aluminum Plate Using Resist Remover Composition for a Semiconductor Substrate of the Present Invention (8)

An aluminum plate having a thickness of 0.3 mm and a size of 20 mm×10 mm was dipped for 20 minutes in composition of the present invention (8) (5 mL) prepared in Example 8 which had been heated to 60° C. After dipping, the aluminum plate was taken out from the dipping liquid, and aluminum contained in the dipping liquid was quantitatively analyzed by a frameless atomic absorption spectrometry (AA-280Z, Furnace Atomic Absorption spectrometer, manufactured by Varian, Inc.). As a result, from the result that only 0.2 ppm of aluminum was detected, it was found that only 0.2 ppm of aluminum had been eluted in the dipping liquid.

Example 22

Evaluation of Tungsten Elusion from a Tungsten Plate Using Resist Remover Composition for a Semiconductor Substrate of the Present Invention (8)

In Example 22, elution amount of tungsten was confirmed in the same method as in Example 21, except that a metal plate as a target for evaluation was changed from an aluminum plate to a tungsten plate. As a result, from the result that only 0.5 ppm of tungsten was detected, it was found that only 0.5 ppm of tungsten had been eluted in the dipping liquid.

Comparative Examples 11 to 12

Evaluation of Metal Elution from a Metal Plate Using Peroxomonosulfuric Acid (Caro's Acid)

In Comparative Examples 11 to 12, peroxomonosulfuric acid (Caro's acid) was prepared by mixing 98% sulfuric acid and 35% hydrogen peroxide aqueous solution in a weight ratio of 10:1, and using the peroxomonosulfuric acid (Caro's acid) (5 mL) which was heated to 130° C., elusion amounts of aluminum and tungsten were confirmed in the same method as in Example 21, except that an aluminum plate in Comparative Example 11 and a tungsten plate in Comparative Example 12 were used as a target metal plate for evaluation. As a result, 3 ppm of aluminum in Comparative Example 11 and 1 ppm of tungsten in Comparative example 12 were detected, respectively. From these results, it was found that 3 ppm of aluminum and 1 ppm of tungsten had been eluted in the dipping liquid, respectively. Results of Examples 21 to 22 and Comparative Examples 11 to 12 are shown in Table 5.

TABLE 5

| Example | Composition of the present invention | Target metal plate | Elution amount to dipping liquid |
|---|---|---|---|
| 21 | (8) | Al | 0.2 ppm |
| 22 | (8) | W | 0.5 ppm |
| Comparative Example | Composition for comparison | Target metal plate | Elution amount to dipping liquid |
| 11 | Caro's acid | Al | 3 ppm |
| 12 | Caro's acid | W | 1 ppm |

From the results of Examples 21 to 22 and Comparative Examples 11 to 12, it was found that since the resist remover composition for semiconductor substrate of the present invention hardly dissolved a metal plate such as aluminum plate, tungsten plate, and the like, the resist remover composition for semiconductor substrate of the present invention was less likely to give an adverse effect such as dissolution of these metal wirings even when the resist remover composition for semiconductor substrate of the present invention was used for a substrate on which a metal wiring of aluminum, tungsten, or the like had been provided. On the other hand, it was indicated that since peroxomonosulfuric acid (Caro's acid) which was a hitherto known resist remover tended to dissolve easily a metal plate such as aluminum plate, tungsten plate, and the like, breaking of a metal wiring and the like could occur when peroxomonosulfuric acid was applied to a semiconductor substrate on which a metal wiring such as aluminum, tungsten, and the like had been provided.

From the results as mentioned above, it can be expected that by treating a semiconductor substrate on which a resist has been formed using the resist remover composition for semiconductor substrate of the present invention, not only a resist can be removed efficiently by a simple method such as dipping, and the like, but also, for example, even in the case when a semiconductor substrate on which a metal wiring such as aluminum wiring and the like had been provided, a resist can be removed efficiently without giving an adverse effect to these metal wirings.

INDUSTRIAL APPLICABILITY

The resist remover composition for semiconductor substrate of the present invention enables to remove a resist in the photolithography process in the semiconductor field simply and efficiently in the photolithography process in the semiconductor field, and further enables to remove even a cured resist film generated in the plasma doping. In addition, since the resist remover composition for semiconductor substrate of the present invention does not give an adverse effect to a metal wiring which has been provided on a semiconductor substrate, the composition can be expected to be suitably used to a semiconductor substrate on which a metal wiring has been provided. Further, since a compound generating a fluorine ion (a fluoride ion) such as, for example, highly corrosive hydrogen fluoride or a salt thereof can be excluded from the composition, it can be expected not only that handling and wastewater treatment of the resist remover composition for semiconductor substrate of the present invention become easy, but also that the resist remover composition for semiconductor substrate of the present invention can be suitably used particularly for a silicon substrate on which an oxide film (silicon oxide film) has been formed which could be corroded by hydrogen fluoride and the like.

In addition, since the method for removing a resist of the present invention is a method which is capable of removing a resist simply and efficiently under a comparatively mild condition, removing of a resist becomes possible without carrying out a treatment which requires a large and expensive equipment such as conventionally used ashing, or a removing under a condition having a possibility to give an adverse effect such as dissolution of a metal wiring, surface oxidation, and the like, to a metal wiring, like use of a hot mixed acid such as Caro's acid.

What is claimed is:

1. A resist remover composition for semiconductor substrate, comprising [I] a carbon radical generating agent selected from the group consisting of [I-i] azonitrile type carbon radical generating agent, [I-ii] azoamide type carbon radical generating agent, [I-iii] chain-like azoamidine type carbon radical generating agent selected from the group consisting of 2,2'-azobis(2-methylpropionamidine)dihydrochloride and 2,2'-azobis[N-(2-carboxyethyl)-2-methylpropionamidine]tetrahydrate, [I-iv] cyclic azoamidine type carbon radical generating agent, [I-v] azoester type carbon radical generating agent, [I-vi] azonitrile carboxylic acid type carbon radical generating agent, [I-vii] azoalkyl type carbon radical generating agent, [I-viii] macroazo type carbon radical generating agent, [I-ix] benzoin alkyl ether type carbon radical generating agent, [I-x] benzylketal type carbon radical generating agent, [I-xi] benzophenone type carbon radical generating agent, [I-xii] aminobenzoate ester type carbon radical generating agent, [I-xiii] 1,2-hydroxyalkylphenone type carbon radical generating agent, [I-xiv] 1,2-aminoalkylphenone type carbon radical generating agent, [I-xv] acylphosphine oxide type carbon radical generating agent, [I-xvi] anthraquinone type carbon radical generating agent, [I-xvii] thioxanthone type carbon radical generating agent, [I-xviii] acridone type carbon radical generating agent, [I-xix] imidazole type carbon radical generating agent, [I-xx] oxime ester type carbon radical generating agent, and [I-xxi] titanocene type carbon radical generating agent, [II] an acid, [III] a reducing agent, and [IV] an organic solvent, and having pH of lower than 7.

2. The composition according to claim 1, wherein the resist remover composition further comprises [V] water.

3. The composition according to claim 2, wherein the resist remover composition further comprises [VI] a surfactant.

4. The composition according to claim 1, wherein the [I] carbon radical generating agent is a compound which generates a carbon radical by irradiation of light having a wavelength of 200 to 750 nm.

5. The composition according to claim 1, wherein the [II] acid is an organic acid.

6. The composition according to claim 1, wherein the [II] acid is at least one kind of acid selected from a group consisting of acetic acid, trifluoroacetic acid, oxalic acid, and citric acid.

7. The composition according to claim 1, wherein the [III] reducing agent is at least one kind of compound selected from a group consisting of hydroxylamine derivative, ascorbic acid and ascorbic acid ester.

8. The composition according to claim 1, wherein pH is in a range of 0 to 4.

9. The composition according to claim 1, wherein the semiconductor substrate is a silicon substrate on which an oxide film has been formed.

10. The composition according to claim 1, wherein the semiconductor substrate is a silicon substrate on which an oxide film has been formed, and a resist has been formed on the upper part of the oxide film.

11. The composition according to claim 9, wherein the semiconductor substrate on which an oxide film has been formed is one which has been subjected to a plasma doping.

12. The composition according to claim 9, wherein the semiconductor substrate on which an oxide film has been formed is one on which a metal wiring has been provided.

13. The composition according to claim 12, wherein the metal wiring is aluminum wiring, tungsten wiring, or copper wiring.

14. The composition according to claim 2, wherein a content of the [I] carbon radical generating agent is 0.1 to 10% by weight, a content of the [II] acid is 0.1 to 5% by weight, a content of the [III] reducing agent is 0.01 to 10% by weight, a content of the [IV] organic solvent is 60 to 99% by weight, and a content of the [V] water is 0.01 to 30% by weight.

15. The composition according to claim 1, comprising substantially no compound generating a fluorine ion.

16. A method for stripping a resist, comprising that the composition according to claim 1 is used.

* * * * *